US012563842B2

(12) United States Patent
Funabasama

(10) Patent No.: US 12,563,842 B2
(45) Date of Patent: Feb. 24, 2026

(54) SEMICONDUCTOR DEVICE, PROTECTION CIRCUIT, AND METHOD FOR MANUFACTURING PROTECTION CIRCUIT

(71) Applicant: Kioxia Corporation, Tokyo (JP)

(72) Inventor: Tomoyuki Funabasama, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 789 days.

(21) Appl. No.: 17/687,286

(22) Filed: Mar. 4, 2022

(65) Prior Publication Data

US 2023/0078873 A1     Mar. 16, 2023

(30) Foreign Application Priority Data

Sep. 14, 2021     (JP) ................................. 2021-149536

(51) Int. Cl.
  *H10D 89/60*          (2025.01)
(52) U.S. Cl.
  CPC ................................. *H10D 89/911* (2025.01)
(58) Field of Classification Search
  CPC ............ H01L 27/0288; H01L 27/0266; H10D 89/911; H10D 1/47
  See application file for complete search history.

(56) References Cited

U.S. PATENT DOCUMENTS 5,838,033 A  *  11/1998  Smooha ............... H10D 89/911
                                      257/213
6,396,113 B1    5/2002  Fujinaga et al.

6,479,870 B1*  11/2002  Chen ................... H01L 27/0251
                                      257/361
2002/0030230 A1*   3/2002  Okawa ............... H01L 27/0288
                                      257/355
2004/0256681 A1*  12/2004  Irino ................... H01L 27/0266
                                      257/E29.326
2005/0017306 A1*   1/2005  Morishita ............... H01L 23/60
                                      257/E27.06
2011/0163384 A1*   7/2011  Takasu ................... H01L 29/78
                                      257/E23.002
2013/0002312 A1    1/2013  Yamazaki et al.

FOREIGN PATENT DOCUMENTS

JP        S60-152059 A     8/1985
JP        2001-148418 A    5/2001
JP        2020-123742 A    8/2020

* cited by examiner

*Primary Examiner* — Erik Kielin
(74) *Attorney, Agent, or Firm* — Foley & Lardner LLP

(57)          ABSTRACT

A semiconductor device includes a first semiconductor layer, a second semiconductor layer provided on the first semiconductor layer, a third semiconductor layer, a gate electrode, a first layer, and an insulating layer. The first and second semiconductor layers have first and second conductivity types. The third semiconductor layer has the second conductivity type, and is provided on the first semiconductor layer and disposed side-by-side with the second semiconductor layer in a first direction. The gate electrode is provided on the first semiconductor layer and between the second and third semiconductor layers. The first layer has a lower impurity concentration than the second semiconductor layer, is provided on the first semiconductor layer and, at one end thereof, is in contact with the second semiconductor layer. The insulating layer is provided on the first layer and, at one end thereof, is in contact with the second semiconductor layer.

14 Claims, 4 Drawing Sheets

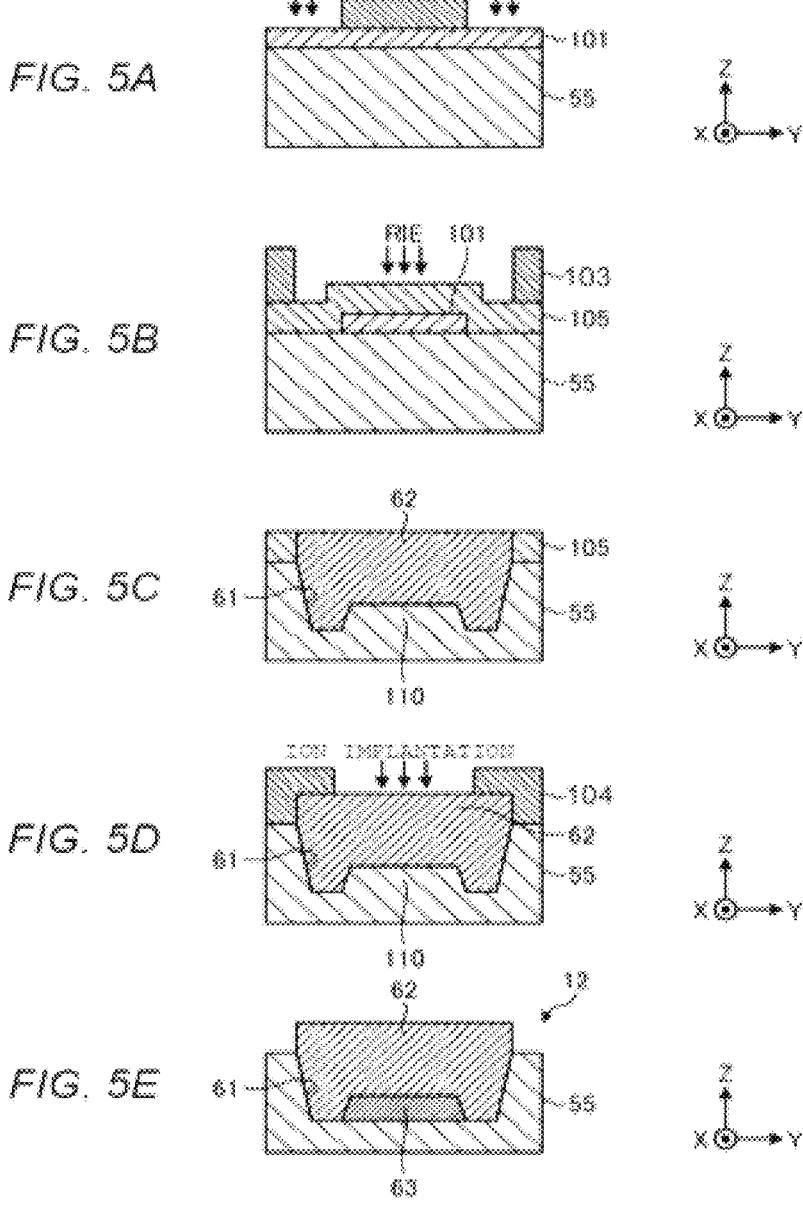

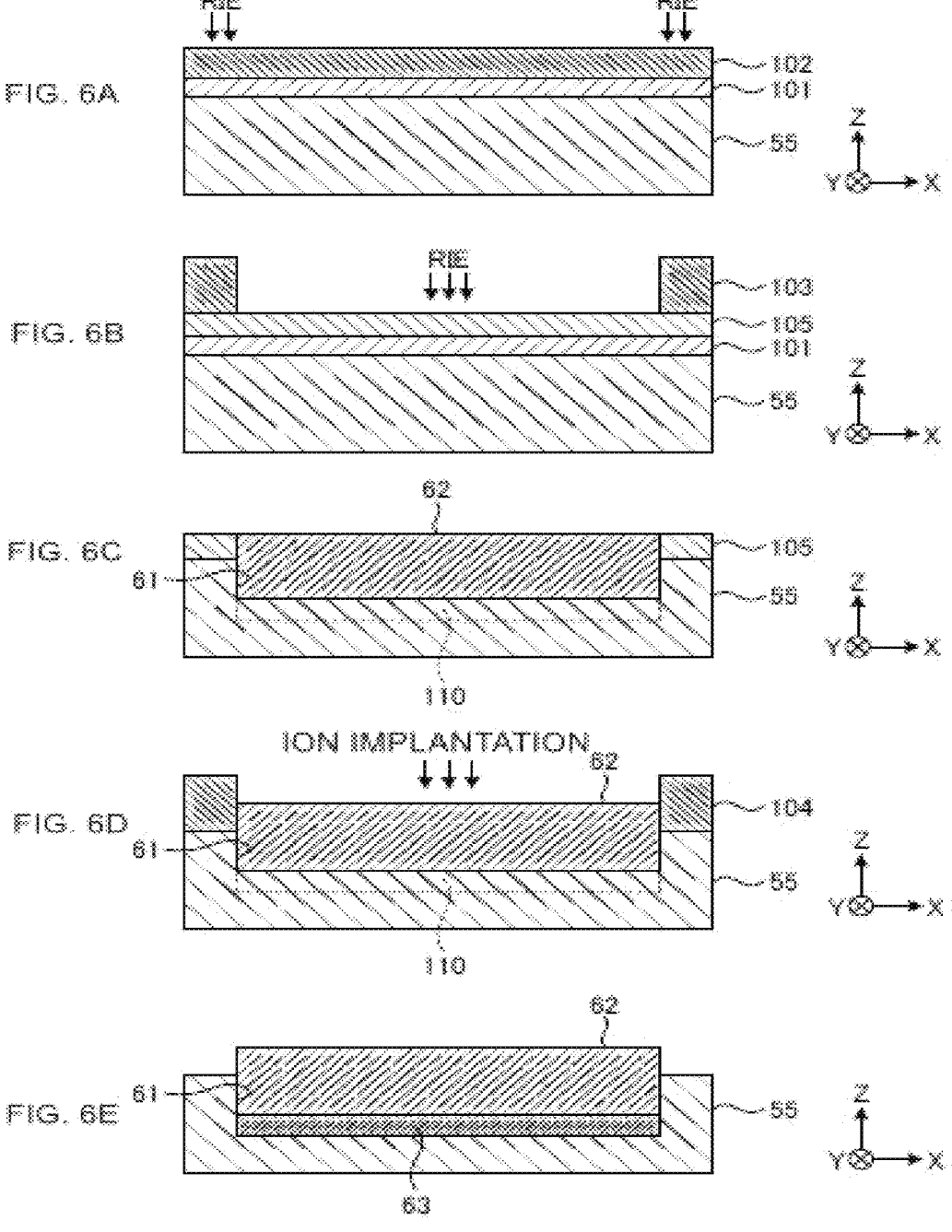

SEMICONDUCTOR DEVICE, PROTECTION CIRCUIT, AND METHOD FOR MANUFACTURING PROTECTION CIRCUIT

CROSS-REFERENCE TO RELATED APPLICATION(S)

This application is based upon and claims the benefit of priority from Japanese Patent Application No. 2021-149536, filed Sep. 14, 2021, the entire contents of which are incorporated herein by reference.

FIELD

Embodiments described herein relate generally to a semiconductor device, a protection circuit, and a method for manufacturing the protection circuit.

BACKGROUND

Some protection circuits, which protect an electronic device from a surge such as an electrostatic discharge, include a transistor for performing a switching operation to prevent a surge from being inputted into an electronic device, and a protective resistor for protecting the transistor. A method using a silicide block is known as a method to form such a protective resistor. However, with existing methods, it is difficult to control the size of a protective resistor.

DESCRIPTION OF THE DRAWINGS

FIGS. 5A through 5E are diagrams illustrating an example method for manufacturing the protection circuit according to at least one embodiment along line B-B of FIG. 2.

FIGS. 6A through 6E are diagrams illustrating an example method for manufacturing the protection circuit according to at least one embodiment along line C-C of FIG. 2.

DETAILED DESCRIPTION

Embodiments provide a protection circuit with high size controllability, and a method for manufacturing the protection circuit.

In general, according to at least one embodiment, a semiconductor device includes a first semiconductor layer, a second semiconductor layer, a third semiconductor layer, a gate electrode, a first layer, and an insulating layer. The first semiconductor layer has a first conductivity type. The second semiconductor layer has a second conductivity type, and is provided on the first semiconductor layer. The third semiconductor layer has the second conductivity type, and is provided on the first semiconductor layer and disposed side-by-side with the second semiconductor layer in a first direction. The gate electrode is provided on the first semiconductor layer and between the second semiconductor layer and the third semiconductor layer. The first layer has a lower impurity concentration than the second semiconductor layer, is provided on the first semiconductor layer and, at its one end, is in contact with the second semiconductor layer. The insulating layer is provided on the first layer and, at its one end, is in contact with the second semiconductor layer.

Embodiments of the present disclosure will now be described with reference to the drawings. The embodiments are not intended to limit the scope of the present disclosure. Components or elements as disclosed herein may include those which are substantially the same or will be obvious to those of ordinary skill in the art.

Figure 1:
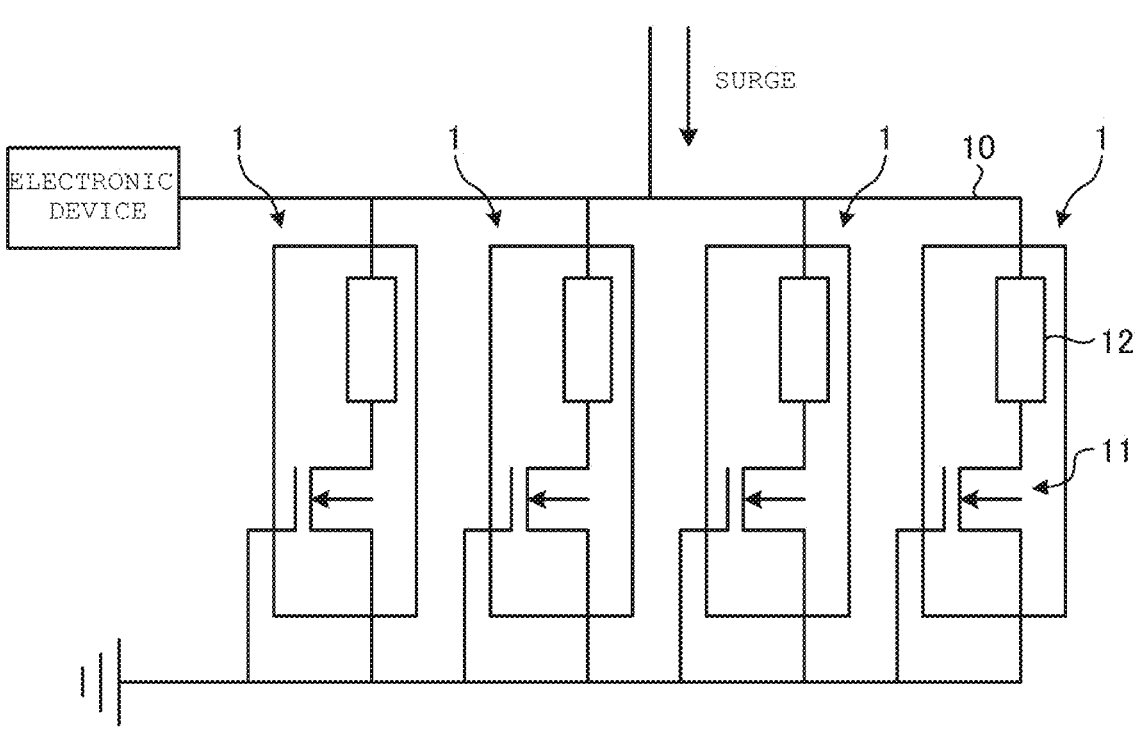
FIG. 1 is a diagram illustrating an example manner of using a protection circuit according to at least one embodiment.

FIG. 1 is a diagram illustrating an example manner of using a protection circuit 1 according to at least one embodiment. The protection circuit 1 of at least one embodiment is designed to protect a particular electronic device (e.g., a processor or a memory) from a surge such as an electrostatic discharge (ESD). In the configuration illustrated in FIG. 1, a plurality of (four in this example) protection circuits 1 are connected in parallel between a conductive wire 10, which is connected to an electronic device to be protected and through which an external current flows, and a ground electrode.

Each protection circuit 1 includes a transistor 11 and a protective resistor 12. The transistor 11 is a switching element which operates according to the level of a surge voltage or a surge current, and operates to guide a surge current to the ground electrode when the surge current or voltage exceeds a threshold value. The protective resistor 12 is a resistor connected between the conductive wire 10 and the transistor 11, and has the effect of avoiding damage to the transistor 11 by a surge current. The protection circuits 1 are each provided with the same protective resistor 12 which exerts a buffering effect that attenuates a surge current. This can prevent a surge current from concentrating on one protection circuit 1 (transistor 11).

FIG. 1 illustrates a case where the transistor 11 is an N-channel MOSFET. However, the transistor 11 is not limited to the particular type. In the case of an N-channel MOSFET, the drain of the transistor 11 is connected to the protective resistor 12 and the source of the transistor 11 is connected to the ground electrode, and a ground voltage is inputted to the gate of the transistor 11. The following description illustrates the protection circuit 1 in the case where the transistor 11 is an N-channel MOSFET.

Figure 2:
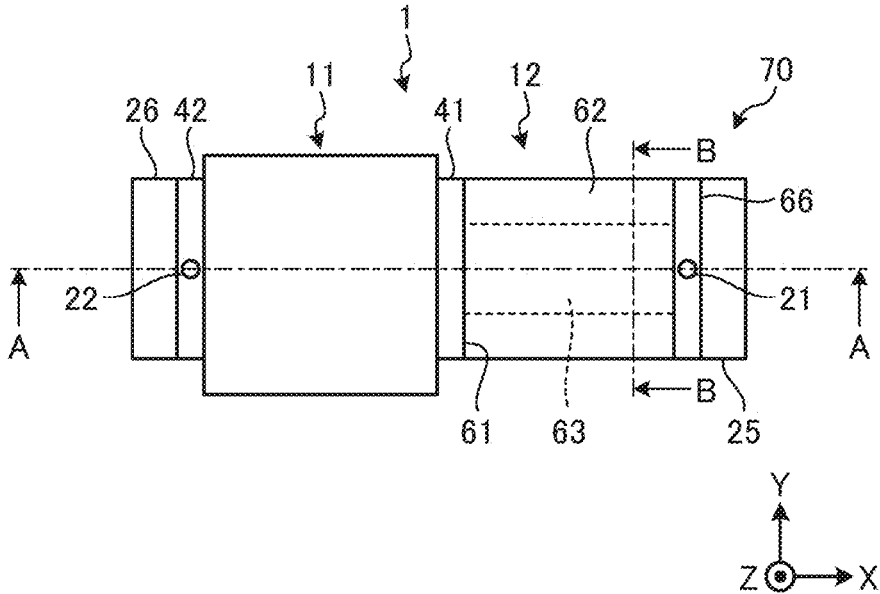
FIG. 2 is a top view showing an example configuration of the protection circuit according to at least one embodiment.
Figure 3:
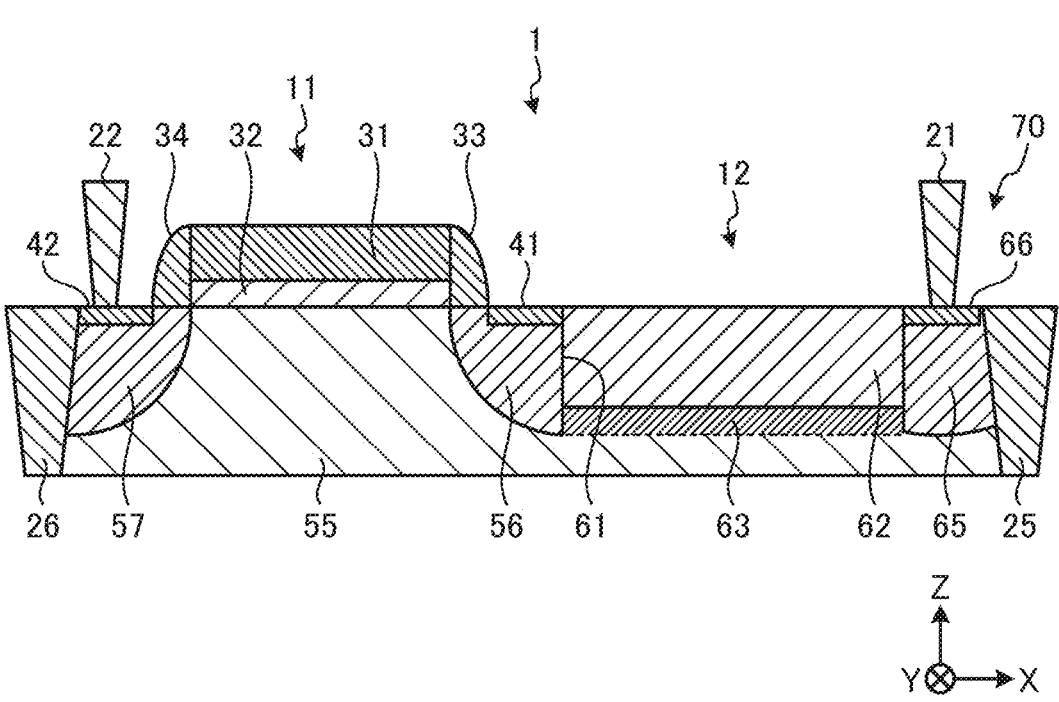
FIG. 3 is a cross-sectional view of the protection circuit according to at least one embodiment along line A-A of FIG. 2.
Figure 4:
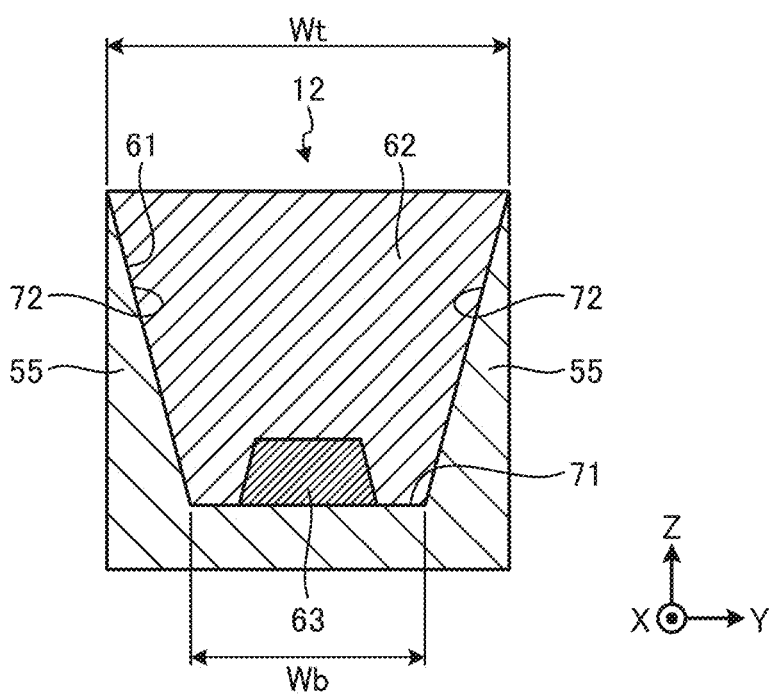
FIG. 4 is a cross-sectional view of the protection circuit according to at least one embodiment along line B-B of FIG. 2.

FIG. 2 is a top view showing an example construction of the protection circuit 1 of this embodiment. FIG. 3 is a cross-sectional view of the protection circuit 1 of this embodiment along line A-A of FIG. 2. FIG. 4 is a cross-sectional view of the protection circuit 1 of this embodiment along line B-B of FIG. 2. In the Figures, X direction corresponds to the lateral direction of the paper plane (the arrangement direction of the transistors 11 and the arrangement direction of the protective resistors 12), Y direction corresponds to a direction perpendicular to the X direction (the width direction of the transistor 11 or the protective resistor 12), and Z direction corresponds to a direction perpendicular to the XY plane (the stacking direction). The X direction is an example of a first direction, the Y direction is an example of a second direction, and the Z direction is an example of a third direction.

As shown in FIGS. 2 and 3, the protection circuit 1 includes the transistor 11, the protective resistor 12, a first contact 21, a second contact 22, a first insulating portion 25, and a second insulating portion 26. The first contact 21 is connected to the conductive wire 10, and the second contact 22 is connected to the ground electrode.

The illustrated transistor 11 is an N-channel MOSFET and, as shown in FIG. 3, includes a gate electrode 31, an insulating oxide film 32, insulating portions 33, 34, a drain electrode 41, a source electrode 42 (an example of a first region), a P-type semiconductor layer 55 (an example of a first semiconductor layer), an N-type diffusion layer 56 (an example of a second semiconductor layer or of a diffusion layer), and an N-type diffusion layer 57 (an example of a third semiconductor layer).

The P-type semiconductor layer 55 is a region which becomes an inversion layer depending on the voltage inputted to the gate electrode 31, and contains an impurity such as boron (B) at a predetermined concentration. The N-type diffusion layer 56, which is in contact with the drain electrode 41, is in contact with a below-described resistance layer 63 of the protective resistor 12. The N-type diffusion layer 57, which is in contact with the source electrode 42, is connected to the ground electrode via the second contact 22.

As shown in FIGS. 2 through 4, the protective resistor 12 includes a groove portion 61, an insulating layer 62, the resistance layer 63 (an example of a first layer), a semiconductor layer 65 (an example of a fourth semiconductor layer), and a silicide layer 66. The silicide layer 66 (an example of a second region) is in contact with the first contact 21 and the semiconductor layer 65. The first contact 21, the silicide layer 66 and the semiconductor layer 65 form an input portion 70 for guiding an external current flowing in the conductive wire 10 (FIG. 1), into the protection circuit 1. The semiconductor layer 65 may be the same semiconductor layer as or a different semiconductor layer from the N-type diffusion layer 57. Further, the semiconductor layer 65 may be a conductive layer having a higher electrical conductivity than the N-type diffusion layer 57.

The groove portion 61 is formed in the N-type diffusion layer 56 such that it separates the input portion 70 and the transistor 11. Thus, the groove portion 61 has a structure similar to the so-called STI (Shallow Trench Isolation). The insulating layer 62 and the resistance layer 63 are formed in the groove portion 61 of this embodiment. As shown in FIG. 4, the groove portion 61 of this embodiment has an inverted trapezoidal shape in a cross-section along the YZ plane. Thus, the width Wt of the opening of the groove portion 61 is larger than the width Wb of a bottom 71 of the groove portion 61.

The insulating layer 62 includes an insulating material, and may include, for example, SiO$_2$ or SiN as a main component.

The resistance layer 63 is a region having a predetermined resistance value (electrical conductivity). The resistance value of the resistance layer 63 is set at a value that can protect the transistor 11 from a surge current inputted from the input portion 70. The resistance value of the resistance layer 63 of this embodiment is higher than that of the N-type diffusion layer 56 and lower than that of the insulating layer 62.

The resistance layer 63 and the N-type diffusion layer 56 of this embodiment contain the same impurity (e.g., B) as that contained in the P-type semiconductor layer 55. The impurity concentration of the resistance layer 63 is lower than the impurity concentration of the N-type diffusion layer 56. Such an impurity concentration can be adjusted with a relatively high accuracy by, for example, the known ion implantation method. The impurity contained in the resistance layer 63 is not limited to the above-described one, and may vary according to the configuration of the transistor 11.

For example, when the transistor 11 is a P-channel MOSFET, the resistance layer and the diffusion layer each contain an impurity, such as As or P, which is the same impurity as that contained in an N-type semiconductor layer.

The resistance layer 63 of at least one embodiment is formed on the bottom 71 of the groove portion 61. The formation of the resistance layer 63 at such a position can increase the productivity of the protective resistor 12 (protection circuit 1). However, the position of the resistance layer 63 is not limited to such a position. For example, the resistance layer 63 may be formed on a side surface 72 of the groove portion 61 or in the center of the insulating layer 62.

As described above, the protective resistor 12 is formed utilizing the structure similar to STI. This makes it possible to enhance controllability of the size of the protective resistor 12 as compared to the method using a silicide block which requires consideration of the amount of penetration of a liquid. The enhancement of the size controllability can reduce an extra design margin, thereby enabling a reduction in the overall size of the protection circuit 1. The protective resistor 12 is a structure including the resistance layer 63 having a lower impurity concentration than the n-type diffusion layer 56. Therefore, the resistance value equivalent to that of the conventional one can be realized by a capacity (the length in the X direction) protective resistor 12 than in the past. This makes it possible to miniaturize the entire protection circuit 1.

A method for manufacturing the protection circuit 1 will now be described.

FIGS. 5A through 5E are diagrams illustrating an example method for manufacturing the protection circuit 1 according to at least one embodiment along line C-C of FIG. 2. FIGS. 6A through 6E are diagrams illustrating an example method for manufacturing the protection circuit according to at least one embodiment along line C-C of FIG. 2. FIGS. 5A through 5E illustrate a process flow in the formation of the protective resistor 12 of the protection circuit 1 along the YZ plane. FIGS. 6A through 6E illustrate a process flow in the formation of the protective resistor 12 of the protection circuit 1 along the XZ plane.

First, as shown in FIG. 5A and 6A, an amorphous silicon layer 101 is formed on the upper surface of the P-type semiconductor layer 55, and a resist 102 is formed on a predetermined area (corresponding to the resistance layer 63) of the upper surface of the amorphous silicon layer 101, followed by RIE (Reactive Ion Etching). As a result, as shown in FIG. 5B and 6B, the amorphous silicon layer 101, having a thickness corresponding to the thickness of the resist 102 of FIG. 5A and 6B, remains on the P-type semiconductor layer 55. For example, amorphous silicon layer 101 is a first mask layer.

Thereafter, as shown in FIGS. 5B and 6B, an SiN layer 105 is formed on the P-type semiconductor layer 55 on which the amorphous silicon layer 101 remains, and a resist 103 is formed on a peripheral area (corresponding to an area lying outside the opening of the groove portion 61) of the SiN layer 105, followed by RIE. For example, SiN layer 105 is a second mask layer. The resist 102 shown in FIG. 5B is a portion corresponding to the outer region in the Y direction of the groove portion 61. The resist 102 shown in FIG. 6B is a portion corresponding to the outer region (N-type diffusion layer 56 and the semiconductor layer 65)in the X direction of the groove portion 61. As a result, as shown in FIGS. 5C and 6C, the groove portion 61, having a depth corresponding to the thickness of the resist 102 of FIGS. 5B and 6B, is formed. Due to the nature of RIE, the etching rate decreases with distance (depth) from the upper surface. Accordingly, the groove portion 61 is naturally formed in an inverted trapezoidal shape. In addition, because of no progress of etching in a portion of the P-type semiconductor layer 55, having a thickness corresponding to the thickness of the amorphous silicon layer 101 of FIG. 5B and 6B, an upwardly-protruding raised portion 110 of the P-type semiconductor layer 55 is formed at the bottom of the groove portion 61. An upwardly-protruding raised portion 110 has a structure formed by projecting a first portion by a second portion deeper than the first portion and the first portion.

Thereafter, as shown in FIGS. 5C and 6C, NSG (undoped silicate glass) or the like is filled into the groove portion 61 to form the insulating layer 62.

Thereafter, as shown in FIGS. 5D and 6D, a resist 104 is formed on a peripheral area of the insulating layer 62, and ion implantation is performed by implanting an ionized material (e.g. BF₃ gas) including an ionized impurity (e.g., B) into the raised portion 110. The ion implantation is performed in such a manner that the impurity concentration of the raised portion 110 after the processing is lower than the impurity concentration of the N-type diffusion layer 56.

The resistance layer 63, having a lower impurity concentration than the N-type diffusion layer 56, is formed at the bottom of the groove portion 61 by the above processing, as shown in FIG. 5E and 6E.

As described above, after the insulating layer 62 and the resistive layer 63 are formed, a protective resistor 12 is formed by forming a semiconductor layer 65 and a silicide layer 66 using an appropriate semiconductor manufacturing process. Thereafter, the transistor 11 is formed using an appropriate semiconductor manufacturing process. The transistor 11 may be formed simultaneously with the semiconductor layer 65 and the silicide layer 66. After the insulating layer 62 and the resistive layer 63 are formed as described above, a protective resistor 12 is formed by forming a semiconductor layer 65 and a silicide layer 66 using an appropriate semiconductor manufacturing process. After the insulating layer 62 and the resistive layer 63 are formed as described above, the semiconductor layer 65 and the silicide layer 66 are formed using an appropriate semiconductor manufacturing process to form a protective resistor 12.

As described above, the manufacturing method of this embodiment includes the steps of forming, in the N-type diffusion layer 56, the groove portion 61 which separates the input portion 70 and the transistor 11; forming the raised portion 110 at the bottom of the groove portion 61; and forming the resistance layer 63 by implanting an ionized material into the raised portion 110. This method can control the size of the protective resistor 12 with high accuracy, and therefore can reduce an extra design margin. In addition, a structure including a resistive layer 63 having a protective resistor 12 is lower than the n-type diffusion layer 56. In addition, a structure including a resistance layer 63 having a protective resistor 12 is lower than the n-type diffusion layer 56.

The resistance value equivalent to the conventional one can be realized with a capacity (X-direction length) protective resistor 12 than in the past. The resistance value equivalent to the conventional one can be realized with a capacity (X-direction length) protective resistor making it possible to reduce the overall size of the protection circuit 1.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first semiconductor layer of a first conductivity type, the first semiconductor layer having a first impurity concentration;
   a second semiconductor layer of a second conductivity type different from the first conductivity type, the second semiconductor layer having a second impurity concentration and disposed on the first semiconductor layer;
   a third semiconductor layer of the second conductivity type, the third semiconductor layer disposed on the first semiconductor layer and arranged apart from the second semiconductor layer in a first direction;
   a gate electrode disposed above the first semiconductor layer in a second direction crossing the first direction and between the second semiconductor layer and the third semiconductor layer;
   a first layer of the first conductivity type disposed on the first semiconductor layer in the second direction, the first layer having an end portion being in contact with the second semiconductor layer in the first direction and having a third impurity concentration lower than the second impurity concentration of the second semiconductor layer; and
   an insulating layer disposed on the first layer, the insulating layer being in contact with the second semiconductor layer at least at one end of the insulating layer;
   wherein neither the second semiconductor layer nor the third semiconductor layer is disposed directly over the first layer in the second direction.

2. The semiconductor device according to claim 1, wherein the gate electrode includes a gate length extending in the first direction and a gate width extending in a second direction intersecting the first direction, a width of the insulating layer in the second direction increases with distance from the side closer to the first layer in a third direction intersecting the first direction and the second direction.

3. The semiconductor device according to claim 1, further comprising a fourth semiconductor layer being in contact with another end of the first layer, the fourth semiconductor layer being in contact with another end of the insulating layer.

4. The semiconductor device according to claim 3, further comprising:
   a first region disposed on the third semiconductor layer;
   a first contact in contact with the first region;
   a second region disposed on the fourth semiconductor layer; and
   a second contact in contact with the second region.

5. The semiconductor device according to claim 4, wherein the another end of the insulating layer is in contact with the second region.

6. The semiconductor device according to claim 1, wherein the gate electrode includes a gate length extending in the first direction and a gate width extending in a second direction intersecting the first direction,
   an interface provided between the first semiconductor layer and a gate insulating layer, the first length from the first layer to a first face in a third direction intersecting the first and second directions is longer than a second length from the interface to the gate electrode.

7. The semiconductor device according to claim 1, wherein the gate electrode includes a gate length extending in the first direction and a gate width extending in a second direction intersecting the first direction, the insulating layer including a first portion being contact with the first layer and a second portion provided at a different location from the first portion in a third direction intersecting the first and second directions, a width of the first portion in the second direction is shorter than a width of the second portion in the second direction.

8. The semiconductor device according to claim 7, wherein a length from the first portion to an interface provided between the first semiconductor layer and the gate insulating layer in the third direction is longer than a length from the second portion to a first face in the third direction.

9. The semiconductor device according to claim 1, wherein the second semiconductor layer includes one of a source or a drain region.

10. The semiconductor device according to claim 9, wherein the third semiconductor layer includes the other of the source or the drain region.

11. The semiconductor device according to claim 1, wherein the insulating layer includes at least one of $SiO_2$ or SiN as a main component.

12. The semiconductor device according to claim 3, further comprising a silicide layer formed on the fourth semiconductor layer.

13. The semiconductor device according to claim 4, wherein the first region includes a source electrode.

14. The semiconductor device according to claim 4, wherein the second region includes a silicide layer.

\* \* \* \* \*